United States Patent
Shao et al.

[19]

[11] Patent Number: 6,156,602
[45] Date of Patent: Dec. 5, 2000

[54] SELF-ALIGNED PRECISE HIGH SHEET RHO REGISTER FOR MIXED-SIGNAL APPLICATION

[75] Inventors: Kai Shao; Shao-Fu Sanford Chu; Cerdin Lee, all of Singapore, Singapore

[73] Assignee: Chartered Semiconductor Manufacturing Ltd., Singapore, Singapore

[21] Appl. No.: 09/368,859

[22] Filed: Aug. 6, 1999

[51] Int. Cl.[7] ............................................. H01L 21/8234
[52] U.S. Cl. ........................ 438/238; 438/200; 438/210; 438/233; 438/241
[58] Field of Search .................................. 257/296, 326, 257/351, 358, 379, 516, 900, 904; 438/200, 210, 231, 233, 238, 241, 382, 385, 387, 390, 394, 395

[56] References Cited

U.S. PATENT DOCUMENTS

| | | | |
|---|---|---|---|
| 5,356,826 | 10/1994 | Natsume | 438/238 |
| 5,489,547 | 2/1996 | Erdeljac et al. | 438/238 |
| 5,543,350 | 8/1996 | Chi et al. | 438/238 |
| 5,605,853 | 2/1997 | Yoo et al. | 438/238 |
| 5,652,174 | 7/1997 | Wuu et al. | 438/238 |
| 5,843,815 | 12/1998 | Liaw | 438/238 |
| 5,866,451 | 2/1999 | Yoo et al. | 438/241 |
| 5,918,119 | 6/1999 | Huang | 438/238 |
| 6,004,841 | 12/1999 | Chang et al. | 438/238 |

*Primary Examiner*—Donald L. Monin, Jr.
*Assistant Examiner*—Hoai Pham
*Attorney, Agent, or Firm*—George O. Saile; Rosemary L. S. Pike

[57] ABSTRACT

A new method is provided for the creation of a resistive load in a semiconductor device whereby the semiconductor device further contains gate electrodes and a capacitor. Field isolation regions separate the active areas; a thin layer of gate oxide is created over these active regions. A first layer of poly is deposited, used for the gate electrode, for the bottom plate of the adjacent capacitor and for the resistor of high ohmic value. The gate poly is doped (in the first layer of poly); optionally the bottom plate of the capacitor can be doped. A dielectric layer is deposited for the dielectric of the capacitor; a second layer of poly is deposited, patterned and etched to form the capacitor top plate. The capacitor (dielectric and bottom plate), poly gates and the load resistor are patterned; the LDD regions for the transistors are created. The (gate, capacitor, resistor) spacers are formed, during and as part of the etch of the gate spacers a resistive spacer (called spacer since it serves to space or separate the two contact points of the resistor) is formed. The source/drain implants for the gate electrodes are performed thereby concurrently performing (self-aligned, due to the resistor spacer) implants for the contact regions of the resistor. All contacts (gate poly, source/drain and two contact points on the resistor) are salicided to achieve lower contact resistance.

24 Claims, 3 Drawing Sheets

SELF-ALIGNED PRECISE HIGH SHEET RHO REGISTER FOR MIXED-SIGNAL APPLICATION

BACKGROUND OF THE INVENTION (1) Field of the Invention

The invention relates to the fabrication of Integrated Circuit (IC) devices and, more particularly, to a method for forming a high value poly resistor of accurate value that is required in mixed-mode configurations, that is applications where capacitors coexist with logic applications on the same Integrated Circuit.

(2) Description of the Prior Art

The developments in the semiconductor industry have, similar to developments in many other industries, been driven by improved semiconductor device performance at reduced cost. The semiconductor industry serves and addresses the data processing industry (computers and the like) and a significant number of peripheral applications (video games and the like) in the entertainment industry. What these applications have in common is that data is handled in digital form and that the functions that are performed by the semiconductor devices are functions of data manipulation or functions of data storage. The former category of functions is also referred to as logic functions, the latter category as memory functions. Since these functions are of a different nature, they have typically been provided by semiconductor devices that address either the logic function or the storage functions but not both simultaneously. This does not imply that no semiconductor device was ever created that did not incorporate both functions. In fact, efforts are being made where, due to a potential increase in device functionality and performance gained at no or at a minimal increment in cost, both the logic functions and the storage functions are provided by the same semiconductor device. Increased use of the chip can also in some instances be achieved by a functional sharing or integration of device features or device functions between the two indicated digital disciplines of logic and storage. Further addressed by this approach is the always important reduction of device and functional interconnect whereby, by mounting devices of logic and storage closely together, device performance can be improved by reducing interconnect resistivity, capacitive coupling, contact resistance, propagation delay and other important electrical performance inhibitors. In present day DRAM devices, capacitive charge and de-charge characteristics are key to high-speed device performance. These characteristics can be improved by, among others, reducing the distance between the storage element (the capacitive storage node) and surrounding elements of logic or device switching.

Where the trend in the semiconductor industry is toward increased use of digital processing, that is processing based on on-off or zero-one conditions in the device circuitry, there are still applications where analog signals, that is signals that have a time dependent value that can vary within a range of values without being restricted to being either one or zero, are being used. Capacitors form a basic component of many of these analog circuits that are used for analog applications such as switched capacitor filters. It is well known in the art that capacitors are widely applied in digital applications such as the storage node for Dynamic Random Access Memory (DRAM) circuits. This ability of capacitors to function in either the digital or the analog mode is referred to as the mixed mode application of the capacitor.

The making of electrical contacts with the various points of interest in a semiconductor device, for instance source and drain regions together with the gate electrode of a Field Effect Transistor (FET), is typically accomplished with the formation of a layer of silicide over the surface of the point of contact for easy and low resistance connectivity. The thereby encountered problem of mask alignment (that is required for the required sequential exposures) is solved by making the process of forming the layer of silicide self-aligned with for instance the gate electrode. From this has emerged the designation of salicide processes which refers to the creation of self-aligned (layers of) silicide. The layer of silicide is formed by the deposition of a layer of reactive metal, such as titanium or cobalt, over the surface of silicon (substrate) where the layer of silicide needs to be formed. The reactive metal is annealed with the underlying silicon forming silicides such as $TiSi_2$ over the regions where low resistance electrical contact must be established.

One of the components that is required for certain semiconductor devices, such as for instance Static Random Access Memory (SRAM) devices, is a resistive load. A resistive load component can, in its simplest form, be created by sandwiching a lightly doped layer of polysilicon between two points of electrical contact. To the points of electrical contact can be connected for instance metal of polysilicon interconnect lines or interconnect lines that are created by N+ diffusion (thereby forming low resistance interconnect lines). The sandwiched layer of poly serves as a resistor, which typically has a high resistive value. Increased N+ dopant concentration in the poly will decrease the resistive value of the poly, another parameter that can be used to manipulate the resistive value is by the selection of the cross section of the layer of poly in a plane that is essentially perpendicular to the flow of current through the layer of poly. An increased surface area of the cross section will decrease the value of the resistance and visa versa. Where the resistor load is applied to the SRAM, the resistor must make electrical contact with the gate electrode and the drain region of the pull-down transistor as well as to the metal line to pass gate transistor. A resistor tab that makes contact with the gate and the drain regions can be created by depositing dopants at the interfaces between these regions and the resistive load. Electrical contact must however be established with the drain region whereby an opening is created to the drain region in the surface of the substrate, this creation of the opening to the drain region removes a significant amount of the dopant from the surface of the substrate in the drain region. This dopant has as yet not been driven into the surface of the substrate by a high temperature-processing step. In sum: the light doping of the poly determines the resistive value of the resistive load, the resistive load is interconnected to the surrounding components by means of a high dope implant on either side of the resistor for which a doping mask is used.

For mixed signal, that is combined digital and analog signal applications, it is required that the resistive load has a high value of ohmic resistance. The value of this ohmic resistance must further be within tight limits; the ohmic resistance must also remain within these tight limits when creating the resistive load within a manufacturing environment and over an extended period of time. Currently, $POCl_3$ is used as a dopant for the polysilicon of the resistive load; this dopant however exhibits a significant amount of lateral diffusion making exact control of the resistive value of the load resistance very difficult to achieve. The blanket implant methodology that is used to establish the interconnect points for the resistive load also does not lend itself to tight implant control due to the fact that a lower thermal budget with high implant energy is used for this implant. The implant mask used during this process further does not accurately define the resistive load. A method must therefore be provided that allows better control of the resistive value of the load resistor while at the same time allowing for tight control of the design parameters that determine the interconnect of the resistive load.

U.S. Pat. No. 5,866,451 (Yoo et al.) shows a process for a mixed mode capacitor with a SRAM and poly resistor. However, this reference differs from the invention.

U.S. Pat. No. 5,543,350 (Chi et al.) shows a SRAM resistor process

U.S. Pat. No. 5,652,174 (Wuu et al.) teaches a SRAM poly resistor method.

U.S. Pat. No. 5,843,815 (Liaw) recites a method for a SRAM having poly load resistors.

SUMMARY OF THE INVENTION

A principle objective of the invention is to provide a method for the creation of a high value polysilicon resistor load component.

Another objective of the invention is to provide a method for the creation of a high value polysilicon resistor load component whereby the ohmic value of the resistor load is within tight limits.

Yet another objective of the invention is to provide a method for the creation of a high value polysilicon resistor load whereby the ohmic value of the resistor load does not vary within the sequential creation in a manufacturing environment of successive resistor load components.

A still further objective of the invention is to avoid lateral diffusion during the creation of a resistive load component.

In accordance with the objectives of the invention a new method is provided for the creation of a resistive load in a semiconductor device whereby the semiconductor device further contains gate electrodes and a capacitor. The resistive load is created using the concept of a self-alignment resistor mask. The active areas in the surface of a substrate are defined with field isolation regions; a thin layer of gate oxide is created over these active regions. The process starts with the deposition of a layer of poly 2 (no layer of poly 1 is used), this poly 2 is used for the gate electrode, for the bottom plate of the adjacent capacitor and for the resistor of high ohmic value. The gate poly is doped; optionally the bottom plate of the capacitor can be doped. A dielectric layer is deposited for the dielectric of the capacitor; a layer of poly 3 is deposited, patterned and etched to form the capacitor top plate. The capacitor (dielectric and bottom plate), poly gates and the load resistor are patterned; the LDD regions for the poly gates are created. The (gate, capacitor, resistor) spacers are formed, a key point of the invention is that during the etch of the spacers a resistive spacer (called spacer since it serves to space or separate the two contact points of the resistor) is formed over the surface of the (poly 2) resistor. The source/drain implants are performed thereby concurrently performing (self-aligned, due to the resistor spacer) implants for the contact regions of the resistor. All contacts (gate poly, source/drain and two contact points on the resistor) are salicided to achieve lower contact resistance.

DESCRIPTION OF THE PREFERRED EMBODIMENTS

Figure 1:
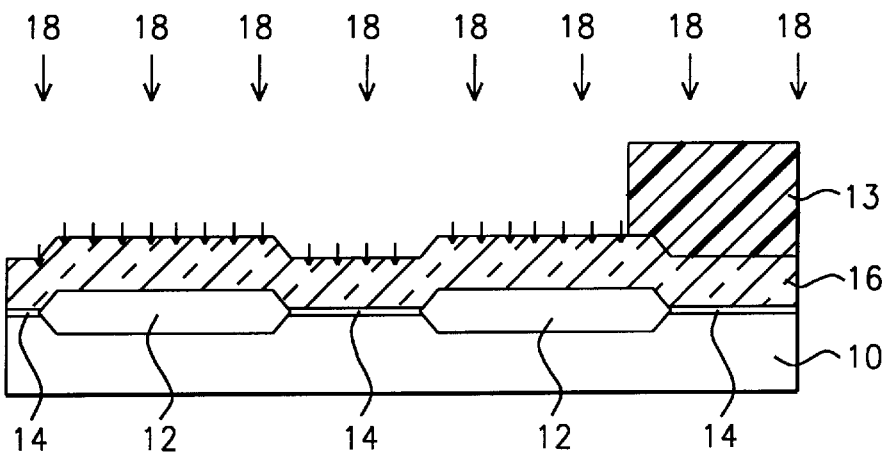
FIG. 1 shows a cross section of the semiconductor substrate after the definition of the active regions, the formation of gate oxide, the deposition of a layer of poly 2 and the implant for the poly gate.

Referring now specifically to FIG. 1, there is shown a cross section of the semiconductor substrate 10 after the definition of the active regions, the formation of gate oxide, the deposition of a layer of poly 2 and the implant for the poly gate.

One of the methods to define active regions in the surface of a semiconductor substrate is with the creation of Field Oxide regions. Field Oxide (FOX) isolation regions are used to electrically isolate the discrete devices, such as Field Effect Transistors (FET's), in ULSI circuits on semiconductor chips that are formed from silicon substrate. One conventional approach in the semiconductor industry for forming field isolation is by the Local Oxidation of Silicon (LOCOS) method. LOCOS uses a patterned silicon nitride ($Si_3N_4$) as an oxidation barrier mask, the silicon substrate is selectively oxidized to form the semi-planar isolation. However, this method requires long oxidation times (thermal budget) and lateral oxidation under the barrier mask limits the minimum spacing between adjacent active device areas, and therefore prevents further increase in device packaging density.

One method of circumventing the LOCOS limitations and to further reduce the field oxide (FOX) minimum features size is to allow shallow trench isolation (STI). One method of making STI is to first etch trenches having essentially vertical sidewalls in the silicon substrate. The trenches are then filled with a CVD of silicon oxide ($SiO_2$) and the $SiO_2$ is then plasma etched back or polished back using CMP, to form the FOX isolation region. It is desirable to make FOX areas that extend higher than the substrate surface to avoid problems of recesses in the field oxide at the edge of the device areas.

The FOX regions 12 can typically be grown by patterning a composite insulator, oxidation mask that contains an overlying layer of silicon nitride and an underlying layer of silicon dioxide. The patterning of this layer is accomplished via conventional photolithography exposure follower by Reactive Ion Etching (RIE). The photoresist that is used for the patterning is removed via plasma oxygen ashing, the surface is wet cleaned and the thick layer of FOX is grown in the regions of the silicon substrate that are not covered with the composite insulator oxidation mask. The growing of the FOX layer is accomplished via thermal oxidation in an oxygen steam ambient at a temperature between about 850 and 1150 degrees C. to a thickness of between about 4000 and 6000 Angstrom. The composite insulator oxidation mask is then removed by using hot phosphoric acid for the removal of the silicon nitride layer and buffered hydrofluoric acid solution for the removal of the underlying layer of silicon dioxide.

The layer 14 of gate oxide is next grown over the surface of the substrate at a temperature between about 800 and 1000 degrees C. in a steam oxygen ambient to a thickness of between about 50 to 300 Angstrom.

The poly 2 layer 16 is next blanket deposited by using Low Pressure Chemical Vapor Deposition (LPCVD) at a temperature between about 500 and 700 degrees C. to a thickness between about 1000 ad 4000 Angstrom, and preferably between about 2000 and 3000 Angstrom. The poly 2 layer is used to form the gate poly, the bottom plate of the capacitor and the body of the load resistor. An N+ implant is performed into layer 16 of poly 2, this implant forms the conductivity level of the NMOS poly gate. During this implant, the PMOS region in the layer of poly 2 is masked with a photoresist mask 13. The layer 16 of poly 2 is in this manner doped (18) with phosphorous ions at a dosage of between about 4E14 and 2E15 atoms/cm$^2$ with an energy of between about 50 and 100 KeV resulting in a N+ poly gate structure.

It is to be noted that the latter doping for the N+ poly gate structure is also applied to the region in the layer 16 of poly 2 where the load resistor is to be formed. This implies that this doping has an impact on and can therefore be used to control the value that is established for the load resistor.

Figure 2:
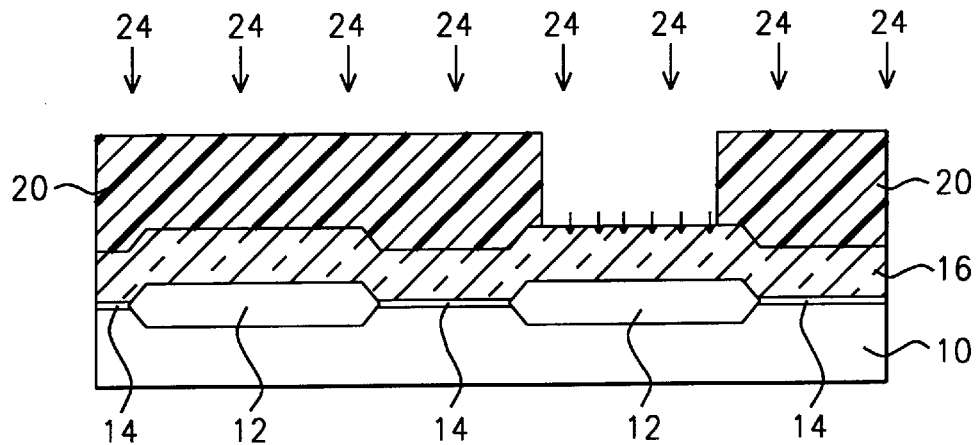
FIG. 2 shows a cross section after the (optional) implant for the bottom plate of the capacitor.

The step as shown in FIG. 2 is an optional step. FIG. 2 shows a cross section after this (optional) implant for the bottom plate of the capacitor. Capacitor mask 20 of photoresist is used to define the capacitor bottom plate. The implant 24 of the poly 2 layer 16 is an arsenic or phosphorous implant with a dopant concentration of between about 4E15 and 6E15 atoms/cm$^2$ at an energy between about 30 and 100 KeV. The optional implant that is shown in FIG. 2 depends on the value of the load resistance that is being created whereby a resistance of higher value requires this capacitor implant in order to improve the capacitive conductivity relative to the resistivity of the created load resistor.

The sheet resistance of the poly layer 16 is typically less than 100 ohm/cm$^2$ while the sheet resistance for the load resistor is typically required to be in excess of 1 Kohm/cm$^2$. The bottom plate of the capacitor therefore needs more doping, the load resistor in the other hand is not critically dependent on specific doping parameters and conditions.

Figure 3:
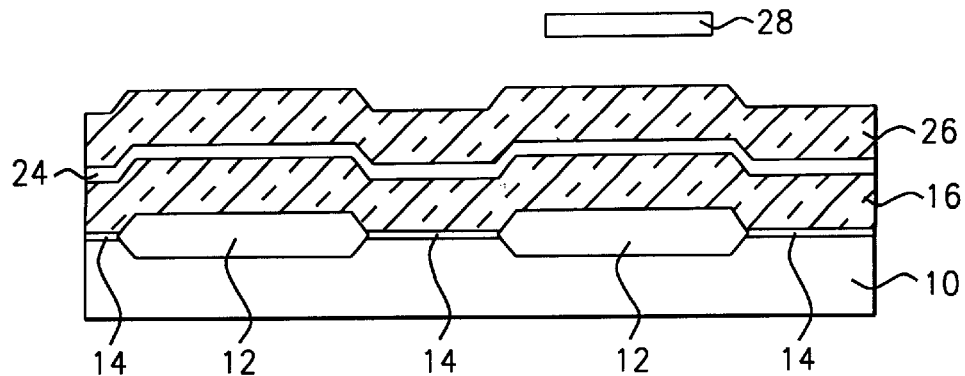
FIG. 3 shows a cross section after the deposition of a layer of dielectric for the capacitor and the deposition and patterning of a layer of poly 3 for the top plate of the capacitor.

FIG. 3 shows a cross section after the deposition of a layer of dielectric for the capacitor and the deposition and patterning of a layer of poly 3 for the top plate of the capacitor.

Layer 24 is a layer of LPCVD silicon dioxide using tetraethylorthosilicate (TEOS) as a source at a temperature between about 600 and 750 degrees C. to a thickness of between about 200 and 400 Angstrom. The layer 24 of TEOS serves as the dielectric for the capacitor.

Over the layer 24 of TEOS is deposited a layer of poly 3. The poly 3 layer 26 is blanket deposited by using Low Pressure Chemical Vapor Deposition (LPCVD) at a temperature between about 500 and 700 degrees C. to a thickness between abut 1000 and 4000 Angstrom, and preferably between about 2000 and 3000 Angstrom. Poly 3 layer 26 is in-situ doped using LPCVD at a temperature between about 530 and 600 degrees C. to a thickness between about 1000 and 4000 angstrom using $SiH_4$ and $PH_3$ as the dopant gas. The poly 3 layer is used to form the top plate of the capacitor. The capacitor mask 28 is used to expose (using conventional process of photolithography) and subsequently etch the layer 26 of polysilicon thereby forming the top plate (not shown in FIG. 3 but shown in FIG. 4) of the capacitor. Polysilicon layer 26 can be etched by exposing the layer to oxygen or oxygen-plasma at high temperatures (over 100 degrees C.). Polysilicon can also be etched using RIE or a high plasma density using an etchant gas having a high selectivity of poly to oxide, such as a gas containing clorine (Cl) species. Techniques are also known in the art whereby polysilicon can be etched using $SF_6$, $SiO_2$ and $Si_3N_4$ with a fluorocarbon.

Figure 4:
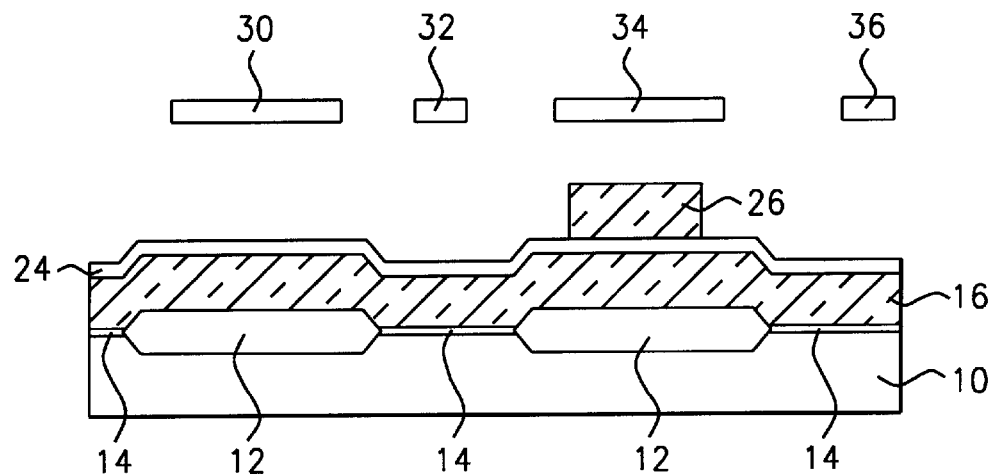
FIG. 4 shows a cross section patterning of the poly gates, the capacitor (dielectric and bottom plate) and the resistive load component.

FIG. 4 shows a cross section patterning of the poly gates, the dielectric and the lower plate of the capacitor and the resistive load component. Resistor mask 30 defines the load resistor, gate mask 32 defines the gate structure for a NMOS device, capacitor mask 34 defines the dielectric and the lower plate of the capacitor while gate mask 36 defines the gate structure for a PMOS device. Conventional processes of photolithography expose layer 26 (of poly 3) and layer 24 (of TEOS) thereby forming the respective elements of the device as indicated. After the resistor, the NMOS gate, the capacitor dielectric and lower plate and the PMOS gate have been patterned, the layer 16 of poly 2 is removed from the exposed areas thereby essentially leaving the poly 2 layers for the resistor, the gate electrodes and the capacitor in place. The contours of these elements are shown in FIG. 5.

Figure 5:
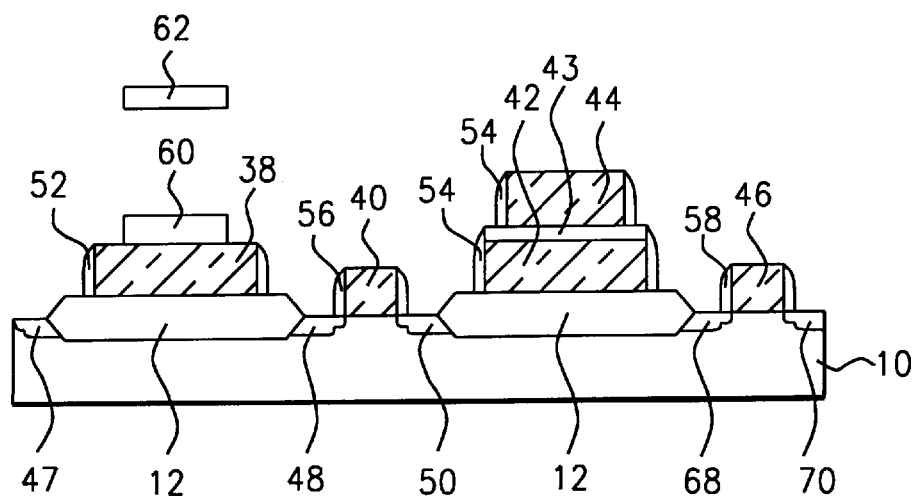
FIG. 5 shows a cross section after the LDD implant for the gate electrodes and the formation of the gate spacers at the same time that a resistive spacer is formed.

FIG. 5 shows a cross section after the LDD implant for the gate electrodes and the formation of the gate spacers, a spacer for the load resistive is formed concurrent with the formation of the gate spacers. The LDD implants of the invention use small doses of implanted impurities in order to avoid any adverse affects on the value of the load resistor that is being formed. In the typical process sequence of forming the gate electrodes of DRAM devices, the step after the gate electrode has been completed is the formation of self-aligned Lightly Doped Diffusion (LDD) regions adjacent to the gate electrode and adjacent to the regions of field oxide (for instance region 47 of N- polarity). These regions of LDD implant are (N-) regions 47, 48 and 50 and (P-) regions 68 and 70. For the NMOS device 40, the LDD regions 48 and 50 are formed by a self-aligned implant of N-type dopant in the source/drain regions in the substrate, this is a first phase in forming the substrate N+ source/drain regions of the MOSFET. For the PMOS device 46, the LDD regions 68 and 70 are formed by a self-aligned implant of P-type dopant in the source/drain regions in the substrate, this is a first phase in forming the substrate P- source/drain regions of the MOSFET. After the formation of oxide sidewall spacers (SWS) on the sidewalls of the polysilicon gate and of the gate oxide, a second N+/P+ implant is performed to set the conductivity of the gate regions to a desired level and to complete the N+/P+ source/drain regions. Titanium is then deposited on the exposed upper surfaces of the N+/P+ source/drain regions and the polysilicon gate region and annealed, thereby causing the titanium to react with the underlying N+/P+ silicon of the substrate source/drain regions and the doped polysilicon gate to form titanium salicide on these surfaces.

It must be remembered that, under the processing sequence of the invention that has been highlighted up to this point, a layer 38, FIG. 5, of poly 2 has remained in place after the process of patterning and etching of the layer 16 of poly 2 as highlighted under FIG. 4. This layer 38 is, during the formation of the LDD regions as indicated above, also subjected to dopant injection and, as a consequence, becomes an N- doped layer of poly 2. It is clear that the dopant used and the density of the dopant used determine the value of the resistor after the process of doping has been completed. To create the resistor, phosphorous or boron can be used as dopants at a dosage of between about 1E13 and 3E14 atoms/cm² and an energy of between about 30 and 60 KeV. This level of doping results in a resistance value of between about 1 and 500 gigaohm and depends on the requirements of the application of the resistor in the device functionality. For the application as shown in FIG. 5, the LDD regions adjacent to the NMOS gate electrode 40 must be N– doped and must therefore be doped using phosphorous (or arson) as the dopant and under the processing conditions that have been indicated above. The LDD regions adjacent to the PMOS gate electrode 46 must be P– doped and must therefore be doped using boron or indium as the dopant and under the processing conditions that have been indicated above.

FIG. 5 shows that, at this point in the discussion, the poly gate electrode structures 40 (NMOS) and 46 (PMOS) have been formed as well as the capacitor bottom plate 42, the capacitor dielectric 43 and the capacitor top plate 54. Further has been formed the load resistor 38, all of the structures having been formed on the surface of substrate 10. LDD regions (N– regions 47, 48 and 50 and P– regions 68 and 70) have been implanted self-aligned with the gate structures and adjacent to the regions 12 of field oxide.

The next processing steps is the formation of the spacers on the sidewall of these structures, that is spacers 52 on the sidewalls of the load resistor, spacers 56 on the sidewalls of the NMOS gate electrode 40, spacers 54 on the sidewalls of the capacitor layers and spacers 58 on the sidewalls of the PMOS gate electrode structure 46.

Typical gate spacer materials are silicon nitride, silicon oxide, BSG, PSG, polysilicon, other materials preferably of a dielectric nature and CVD oxide formed from a TEOS source. Often used are amorphous materials that inhibit the deposition of epitaxial silicon thereupon.

Forming a gate spacer comprises, for instance, the thermally growing, grown in an oxygen steam ambient at a temperature between about 850 and 1000 degrees C. and to a thickness of about 50 to 200 Angstrom, of a thin oxide on the sides of said gate electrode using a short dry-oxidation process whereupon a conformal CVD oxide film is deposited by decomposing TEOS at between 600 and 750 degrees C. followed by an anisotropic dry etch thereby leaving the gate spacers on the sidewalls of the gate electrodes.

Another method of forming gate spacers is by a process including a substantially conformal deposition within the trench of a spacer of material that is selected from the group consisting of nitride, oxide, BSG, PSG and any combination thereof, and a subsequent, substantially anisotropic etch of this spacer material.

Concurrent with the formation of the indicated spacers (and as part of this process) the load resistor spacer 60 is formed on the surface of the body 52 of the load resistor by using the resistor block mask 62. The purpose of spacer 60 is to separate (or space) the contacts of the load resistor 52 as will become apparent during the subsequent discussion. The load resistor spacer is therefore formed using the same materials as previously indicated for the spacers 52, 56, 54 and 58; the spacer 60 is typically formed to a thickness of between 1500 and 4000 Angstrom.

Figure 6:
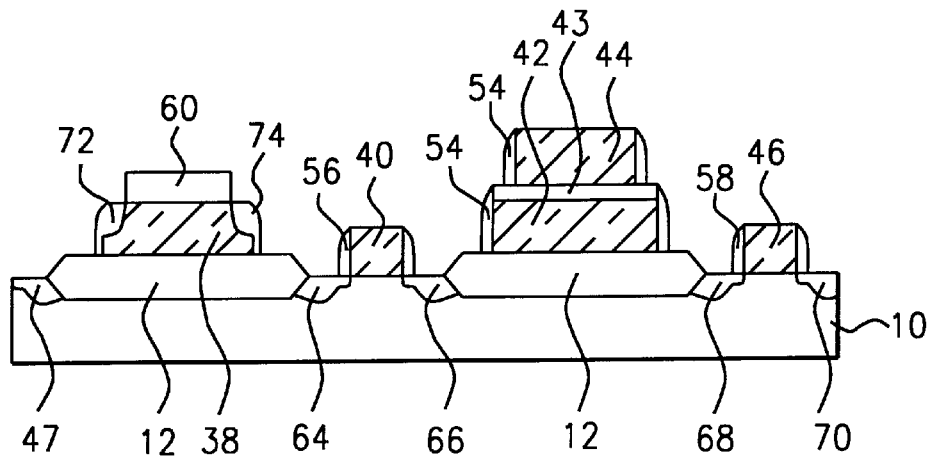
FIG. 6 shows a cross section after the implant of the source/drain regions as well as the contact regions of the resistive load component. This cross section implies salicidation of the contact regions.

FIG. 6 shows the completion of the (N+) source 64 and (N+) drain 66 regions of the NMOS gate electrode 40, the (P+) source 68 and (P+) drain 70 regions of the PMOS gate electrode 46, as well as concurrent N+ implant of the contact regions 72 and 74 of the load resistor 38. The latter implant is done at the same time as the previously detailed N+ implant of the source 64 and drain 66 regions of the NMOS gate electrode 40 making regions 72 and 74 low resistance N+ regions. It must also be pointed out that the N+ implant into the contact regions 72 and 74 of the load resistance 38 is spaced by the spacer 60, the implant is therefore self-aligned with the resistance. This approach therefore eliminates the use of the contact mask implant that has been required in typical applications where an extra mask is needed for the implant of the N+ resistor contacts.

To establish electrical points of contact with the various areas, the surfaces where these contacts must be made are then salicided, that is the top surfaces of regions 72 and 74 and the surfaces of the source/drain regions (64/66 and 68/70), the surface of the gate electrodes (40 and 46) and the top (44) and bottom plate (42) of the capacitor. This process of salicidation is, as previously indicated, performed by the deposition of a layer of reactive metal, such as titanium or cobalt, over the surfaces where the layer of silicide needs to be formed. The reactive metal is annealed with the underlying layer (of poly 2, silicon or TEOS) forming silicides such as $TiSi_2$ over the regions where the (low resistance) electrical contact must be established.

Figure 7:
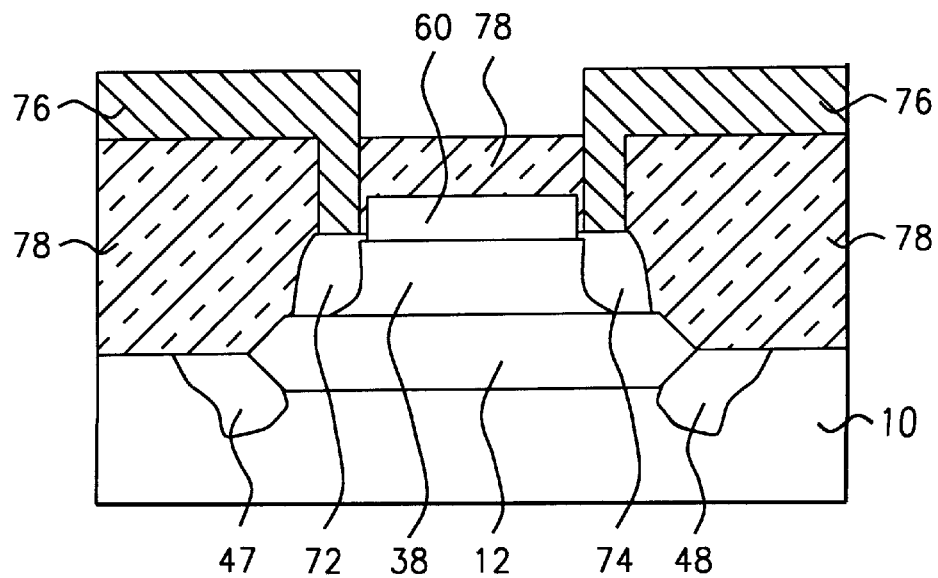
FIG. 7 shows a detailed cross section of the resistive load with its immediate surrounding regions.

FIG. 7 shows a cross section of a detailed view of the load resistor. Most of the elements that are shown in this cross section have previously been discussed, remains to be pointed out the deposition of a layer 78 of Intra Level Dielectric (ILD). This layer has been patterned and etched to establish contact points with regions 72 and 74 of the load resistor, a layer of metal has been deposited over the layer 78 of ILD and selectively etched to remove the metal from above the layer of ILD in order to avoid electrical shorts between the contact regions 72 and 74 of the load resistor 38. A final process of polishing the surface of the layer 76 of metal completes the creation of the load resistor in the device environment that has been selected for the subject description as an example of a load resistor application. Similar processes are performed to establish points of electrical contact with the surface of the source/drain regions 48/50 of the NMOS gate 40, the surface of NMOS gate 40, the source/drain regions 68/70 of PMOS gate 46 and the surface of PMOS gate 46. These electrical contacts have not been shown in the artwork of the invention for reasons of clarity and because these processes are not basic to the method of the invention.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for forming a self-aligned precision resistor on a semiconductor substrate for mixed-signal applications, said self-aligned resistor to be formed concurrent with the formation of gate electrodes and a capacitor on said semiconductor substrate, comprising the steps of:

providing a semiconductor substrate said substrate having active regions defined by regions of surface isolation therein whereby a layer of gate oxide overlays said active regions;

depositing a first layer of poly over the surface of said gate oxide thereby including said regions of surface isolation;

performing an ion implant to establish the conductivity of a NMOS gate electrode in said first layer of poly;

performing an ion implant to establish the conductivity of a PMOS gate electrode in said first layer of poly;

depositing a dielectric layer over the surface of said first layer of poly;

depositing a second layer of poly over the surface of said dielectric layer;

patterning and etching said second layer of poly thereby forming a top plate of a capacitor;

patterning and etching said dielectric layer and said first layer of poly thereby forming the structures for said gate electrodes, the structure for said resistor and the structure for capacitor dielectric and bottom plate layer of said capacitor thereby completing the structure for said capacitor;

forming the LDD regions for the source and drain regions of said gate electrodes;

creating spacers for said structures for said gate electrodes for said capacitor structure and for said structure for said resistor thereby concurrently forming a resistor spacer over the surface of said resistor;

completing the formation of the source and drain regions of said gate electrodes thereby concurrently forming regions of electrical contact on the surface of said resistor; and forming layers of salicide on the surfaces of points of electrical contact.

2. The method of claim 1 wherein said regions of surface isolation contain a minimum of two regions whereby:

the leftmost region forms field oxide region #1;

the rightmost region forms field oxide region #2;

gate electrodes of opposite polarities are adjacent to each of the field oxide regions;

field oxide region #1 is the field oxide region over which a high precision high value load resistor is created;

field oxide region #2 is the field oxide region over which a capacitor is created;

a NMOS polarity type gate electrode is located between field oxide region #1 and field oxide region #2; and a PMOS polarity type gate electrode is located adjacent to field oxide region #2.

3. The method of claim 1 wherein said first layer of poly is contains poly 2 deposited to a thickness of between about 1000 and 5000 Angstrom.

4. The method of claim 1 wherein said dielectric layer contains TEOS deposited to a thickness of between 100 and 1000 Angstrom.

5. The method of claim 1 wherein said second layer of poly is deposited to a thickness of between about 1000 and 5000 Angstrom.

6. The method of claim 1 wherein said performing an ion implant to establish the conductivity of a gate electrode is performing ion implant into said first layer of poly that is shielded such and of a polarity species such that regions of conductivity for NMOS and PMOS gate electrodes are created in said first layer of poly that are adjacent to each of the field oxide regions with the restriction that the MOS devices that are created adjacent to each of the field oxide regions are of opposite polarity.

7. The method of claim 6 wherein said ion implant to create NMOS devices is doping said first layer of poly with phosphorous or arson ions at a dosage of between about 4E14 and 2E15 atoms/cm$^2$ with an energy of between about 50 and 100 KeV resulting in a N+ poly gate structure.

8. The method of claim 6 wherein said ion implant to create PMOS devices is doping said first layer of poly with indium or boron ions at a dosage of between about 4E14 and 2E15 atoms/cm$^2$ with an energy of between about 10 and 50 KeV resulting in a P+ poly gate structure.

9. The method of claim 1 wherein said patterning and etching said second layer of poly is creating a layer of said second poly that overlays and aligns with said second field oxide region thereby creating the top plate of a capacitor.

10. The method of claim 1 wherein said patterning and etching said dielectric layer and said first layer of poly is:

patterning said resistor in a pattern that overlays and aligns with said first region of field oxide;

patterning said gate electrodes in a pattern that locates said gate electrodes between and adjacent to said field oxide regions;

patterning said capacitor dielectric and bottom plate in a pattern that underlies said top plate of said capacitor whereby said pattern furthermore overlays said second field oxide region; and removing said dielectric layer and said first layers of poly in accordance with said patterns for said resistor, said gate electrodes and said capacitor thereby leaving said first layer of poly in place and forming the body of said resistor and said gate electrodes thereby furthermore leaving said first layers of poly and dielectric layer in place and forming the dielectric and bottom layer of said capacitor.

11. The method of claim 1 wherein said LDD implant for a NMOS implant is using arsenic with an energy within the range of between 1 to 10 KeV and a dose within the range of between 1e14 to 1e16 atoms/cm$^2$.

12. The method of claim 1 wherein said LDD implant for a NMOS implant is using phosphorous with an energy within the range of between 10 to 50 KeV and a dose within the range between 1e12 to 5e13 atoms/cm$^2$.

13. The method of claim 1 wherein said LDD implant for a PMOS implant is using indium with an energy within the range of between 1 to 10 KeV and a dose within the range of between 1e14 to 1e16 atoms/cm$^2$.

14. The method of claim 1 wherein said LDD implant for a PMOS implant is using boron with an energy within the range of 5 to 40 keV and a dose within the range of 1e12 to 5e13 atoms/cm$^2$.

15. The method of claim 1 wherein said creating spacers for said structures for said gate electrodes for said capacitor structure and for said structure for said resistor thereby concurrently forming a resistor spacer over the surface of said resistor is:

depositing in a substantially conformal manner a layer of material that is selected from the group of nitride, oxide, BSG, PSG and any combination thereof, polysilicon, over the surface of said structures thereby including said resistor, gate electrodes and capacitor structures thereby furthermore including the exposed surface of said substrate;

masking said resistor to a pattern such that the surface of said resistor is essentially blocked off from a subsequent step of etching in a geometrically centered manner whereby said masking covers most of the surface of said resistor thereby leaving two separate sections at opposite extremities of the surface of said resistor exposed; and performing a substantially anisotropic etch of said layer of material.

16. The method of claim 1 wherein said completing the formation of the source and drain regions of said gate electrode is performing N+ polarity type implants the are self-aligned with the NMOS gate and performing P− polarity type implants that are aligned with the PMOS gate.

17. The method of claim 16 wherein said N+ polarity type implants are implanting arsenic or phosphorous at a dose of between about 2.0E14 and 1.0E16 atoms/cm$^2$ and an energy of between about 30 and 100 KeV.

18. The method of claim 16 wherein said P− polarity type implants are implanting boron or indium at a dose of between about 1.0E15 and 1.0E16 atoms/cm$^2$ and an energy of between about 50 and 90 KeV.

19. The method of claim 1 wherein said forming regions of electrical contact on the surface of said resistor is exposing the surface of said resistor to said N+ polarity implant that is applied to complete said formation of said source and drain regions for said NMOS gate electrode whereby the surface of said resistor is partially shielded from said exposure by said resistor spacer over the surface of said resistor thereby forming regions of high electric conductivity in said two separate sections at opposite extremities of the surface of said resistor.

20. The method of claim 1 wherein said surface of points of electrical contact contains the surfaces of said source and drain regions, the surface of said top plate and the said bottom plate of said capacitor, the surface of said gate electrodes and the surface of said two separate sections at opposite extremities of the surface of said resistor.

21. The method of claim 1 wherein said forming layers of salicide on the surface of points of electrical contact is depositing a layer of reactive metal, such as titanium or cobalt, over said surfaces followed by a rapid thermal annealing in a temperature range of between 600 and 700 degrees C. for a time of between 20 and 40 seconds and then a rapid thermal annealing in a temperature of between about 800 and 900 degrees C. for a time between 20 and 40 seconds thereby forming suicides such as TiSi$_2$ over the regions where low resistance electrical contact must be established.

22. The method of claim 1 with the additional step of exposing said first layer of poly to an N+ implantation said step to be performed prior to said dielectric layer thereby establishing the conductivity of the bottom plate of said capacitor.

23. The method of claim 22 wherein said N+ implantation is an arsenic or phosphorous implant with a dopant concentration of between about 1.2E20 and 2.8E20 atoms/cm$^2$ at an energy between about 30 and 100 KeV.

24. The method of claim 1 with the additional steps of forming electrical contacts to said salicided points of electrical contact said steps to be performed after said step of forming layers of salicide on the points of electrical contact, said steps to comprise:

depositing a layer of Inter Level Dielectric (ILD) over the surface of said resistor, said gate electrodes, said capacitor, said salicided points of electrical contact and the exposed surface of said substrate surface isolation regions;

patterning said layer of ILD in an ILD pattern that matches and aligns with the pattern of said salicided points of electrical contact;

etching said layer of ILD in accordance with said ILD pattern thereby creating openings in said layer of ILD;

blanket depositing a layer of metal over the surface of said layer of ILD thereby including said openings in said layer of ILD; and patterning said layer of metal in accordance with said ILD pattern whereby said metal pattern as a minimum matches and aligns with said ILD pattern whereby said pattern further allows for additional branching, metal interconnects and fan-out from said ILD pattern.

* * * * *

UNITED STATES PATENT AND TRADEMARK OFFICE
CERTIFICATE OF CORRECTION

PATENT NO. : 6,156,602
DATED : December 5, 2000
INVENTOR(S) : Kai Shao, Shao-Fu Sanford Chu, Cerdin Lee It is certified that error appears in the above-identified patent and that said Letters Patent is hereby corrected as shown below:

On the Title page, item (54), please delete "Self-Aligned Precise High Sheet RHO Register for Mixed-Signal Application" and replace it with --Self-Aligned Precise High Sheet RHO Resistor for Mixed-Signal Application--.

Signed and Sealed this

First Day of May, 2001

Attest:

NICHOLAS P. GODICI

*Attesting Officer*   *Acting Director of the United States Patent and Trademark Office*